(12) United States Patent
Hirose et al.

(10) Patent No.: US 10,420,221 B2
(45) Date of Patent: Sep. 17, 2019

(54) WIRING BOARD DESMEAR TREATMENT METHOD

(71) Applicant: Ushio Denki Kabushiki Kaisha, Tokyo (JP)

(72) Inventors: Kenichi Hirose, Tokyo (JP); Makoto Wasamoto, Tokyo (JP); Shinichi Endo, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 232 days.

(21) Appl. No.: 15/106,039

(22) PCT Filed: Nov. 21, 2014

(86) PCT No.: PCT/JP2014/080914
§ 371 (c)(1),
(2) Date: Jun. 17, 2016

(87) PCT Pub. No.: WO2015/093229
PCT Pub. Date: Jun. 25, 2015

(65) Prior Publication Data
US 2016/0324007 A1    Nov. 3, 2016

(30) Foreign Application Priority Data
Dec. 20, 2013    (JP) ................................ 2013-263285

(51) Int. Cl.
*H05K 3/00* (2006.01)
*H05K 3/28* (2006.01)
(Continued)

(52) U.S. Cl.
CPC .......... *H05K 3/0055* (2013.01); *B32B 3/266* (2013.01); *B32B 15/08* (2013.01); *B32B 15/20* (2013.01);
(Continued)

(58) Field of Classification Search
CPC ...... H05K 3/0055; B32B 3/266; B32B 15/08; B32B 15/20; B32B 27/06; B32B 27/08
See application file for complete search history.

(56) References Cited

U.S. PATENT DOCUMENTS 5,985,040 A * 11/1999 Carano ................ H05K 3/0055
134/2
6,261,745 B1 * 7/2001 Tanabe .................... G03F 7/425
257/E21.228

(Continued)

FOREIGN PATENT DOCUMENTS

JP    8-180757 A    7/1996
JP    2002-009435 A    1/2002
(Continued)

OTHER PUBLICATIONS

International Search Report issued in PCT/JP2014/080914; dated Dec. 16, 2014.
(Continued)

*Primary Examiner* — Minh N Trinh
(74) *Attorney, Agent, or Firm* — Studebaker & Brackett PC

(57) ABSTRACT

A desmear treatment method for a wiring board material is provide that is capable of performing desmear treating on the interior of a through hole formed in an insulating layer without requiring complicated steps and obtaining an insulating layer having appropriate surface roughness. The desmear treatment method comprises forming a hole passing through an insulating layer, wherein the insulating layer is made of a resin containing a filler, and desmear treating the wiring board material with radicals. The wiring board material includes a depletable resist layer formed on the insulating layer, and the depletable resist layer is made of a resin to be depleted in the desmear treatment step. A method of manufacturing a wiring board material to be subjected to the
(Continued)

desmear treatment method and a composite insulating layer forming material used in the manufacturing method are also disclosed.

7 Claims, 2 Drawing Sheets

(51) Int. Cl.

| | | |
|---|---|---|
| *B32B 3/26* | (2006.01) | |
| *B32B 27/06* | (2006.01) | |
| *C09D 133/02* | (2006.01) | |
| *C09D 163/00* | (2006.01) | |
| *B32B 15/08* | (2006.01) | |
| *B32B 15/20* | (2006.01) | |
| *B32B 27/08* | (2006.01) | |
| *B32B 27/28* | (2006.01) | |
| *B32B 27/30* | (2006.01) | |
| *B32B 27/32* | (2006.01) | |
| *B32B 27/36* | (2006.01) | |
| *B32B 27/38* | (2006.01) | |
| *B32B 27/40* | (2006.01) | |

(52) U.S. Cl.
CPC ............. *B32B 27/06* (2013.01); *B32B 27/08* (2013.01); *B32B 27/28* (2013.01); *B32B 27/281* (2013.01); *B32B 27/30* (2013.01); *B32B 27/308* (2013.01); *B32B 27/32* (2013.01); *B32B 27/36* (2013.01); *B32B 27/38* (2013.01); *B32B 27/40* (2013.01); *C09D 133/02* (2013.01); *C09D 163/00* (2013.01); *H05K 3/0026* (2013.01); *H05K 3/0035* (2013.01); *H05K 3/28* (2013.01); *B32B 2255/10* (2013.01); *B32B 2255/26* (2013.01); *B32B 2264/102* (2013.01); *B32B 2264/104* (2013.01); *B32B 2307/202* (2013.01); *B32B 2307/206* (2013.01); *B32B 2307/418* (2013.01); *B32B 2307/538* (2013.01); *B32B 2307/732* (2013.01); *B32B 2457/08* (2013.01); *H05K 2203/0285* (2013.01); *H05K 2203/095* (2013.01); *H05K 2203/308* (2013.01)

(56) References Cited

U.S. PATENT DOCUMENTS

| | | | | |
|---|---|---|---|---|
| 7,955,454 | B2* | 6/2011 | Yamano | H05K 3/4661 156/253 |
| 2010/0230142 | A1* | 9/2010 | Bamba | H05K 3/0055 174/255 |
| 2012/0085730 | A1* | 4/2012 | Sasaki | H05K 3/4661 216/13 |
| 2013/0199830 | A1* | 8/2013 | Morita | C08L 63/00 174/258 |
| 2016/0324007 | A1* | 11/2016 | Hirose | H05K 3/0055 |

FOREIGN PATENT DOCUMENTS

| | | |
|---|---|---|
| JP | 2002-036255 A | 2/2002 |
| JP | 2005-050999 A | 2/2005 |
| JP | 2010-010639 A | 1/2010 |
| JP | 2010-056274 A | 3/2010 |
| JP | 2013-038141 A | 2/2013 |
| WO | 2010/150310 A1 | 12/2010 |

OTHER PUBLICATIONS

Written Opinion issued in PCT/JP2014/080914; dated Dec. 16, 2014.

\* cited by examiner

WIRING BOARD DESMEAR TREATMENT METHOD

TECHNICAL FIELD

The present invention relates to a desmear treatment method for a wiring board material in which an insulating layer made of a resin containing a filler is layered on a conductive layer, a method of manufacturing a wiring board material to be subjected to the desmear treatment method, and a composite insulating layer forming material used in the above-described desmear treatment method or the above-described manufacturing method.

BACKGROUND ART

Multilayer wiring boards in which insulating layers and conductive layers (wiring layers) are layered alternately have been known as wiring boards for mounting semiconductor elements such as semiconductor integrated circuit elements, for example. In such a multilayer wiring board, a via hole or a through-hole extending so as to pass through one or more insulating layers in the thickness direction thereof is formed to electrically connect one conductive layer to another conductive layer.

In a manufacturing process of the multilayer wiring board, a wiring board material, which is formed by an insulating layer and a conductive layer layered on each other, is subjected to drill machining or laser machining to remove part of the insulating layer, thereby forming a through hole such as a via hole or a through-hole. When such a through hole is formed in the insulating layer, smear (residue), resulting from the material constituting the insulating layer, is generated in the wiring board material. Thus, a desmear treatment for removing such smear is performed on the wiring board material.

A wet treatment method of treating smear with an alkaline solution prepared by dissolving potassium permanganate or sodium hydroxide and a dry treatment method of treating smear with ultraviolet rays and ozone or oxygen radicals generated by such ultraviolet rays have been known in the art as the desmear treatments. In such a desmear treatment method, the smear attached to the interior of the via hole or the through-hole is removed and a surface of the insulating layer is roughened.

In the above-described desmear treatment method, however, if the desmear treatment is performed under conditions capable of sufficiently removing the smear, the surface of the insulating layer is excessively roughened. This is because the filler contained in the insulating layer is exposed on the surface of the insulating layer due to the excessive decomposition of the resin constituting the insulating layer. Thus, if the line and space of the conductive layer formed on the insulating layer are each not more than 15 μm, for example, problems such as the fall of wiring and deterioration in responsiveness for high-frequency signals occur.

In order to solve such problems, methods according to which in a state where a protective layer is formed on a surface of an insulating layer, a through hole passing through the protective layer and the insulating layer is formed, and then a desmear treatment is performed on the inner surface of the through hole (see Patent Literatures 1 and 2) have been proposed.

In such a method, however, the protective layer needs to be removed after the desmear treatment. Moreover, if the surface roughness of the insulating layer is too low, the surface of the insulating layer further needs to be roughened. Thus, a problem of complicating the entire treatment process occurs.

CITATION LIST

Patent Literature

Patent Literature 1: Japanese Patent Application Laid-Open No. 2010-10639
Patent Literature 2: Japanese Patent Application Laid-Open No. 2010-56274

SUMMARY OF INVENTION

Technical Problem

The present invention has been made in view of the foregoing circumstances and has as its object the provision of a desmear treatment method for a wiring board material, capable of sufficiently performing a desmear treatment on the interior of a hole formed in an insulating layer without requiring a complicated treatment step and capable of obtaining an insulating layer having appropriate surface roughness.

The present invention has as another object the provision of a method of manufacturing a wiring board material to be subjected to the above-described desmear treatment method and a composite insulating layer forming material used in the above-described desmear treatment method or the above-described manufacturing method.

Solution to Problem

A desmear treatment method for a wiring board material according to the present invention is a desmear treatment method for a wiring board material in which an insulating layer made of a resin containing a filler is layered on a conductive layer. The desmear treatment method includes: a hole forming step of forming a hole passing through the insulating layer in a thickness direction thereof; and a desmear treatment step of treating the wiring board material having undergone the hole forming step with radicals. The wiring board material to be subjected to the desmear treatment step includes a depletable resist layer formed on the insulating layer, and the depletable resist layer is made of a resin to be depleted in the desmear treatment step.

In the desmear treatment method for a wiring board material according to the present invention, the wiring board material to be subjected to the hole forming step may preferably be provided with the depletable resist layer formed on the insulating layer.

Moreover, the desmear treatment step may preferably be performed by radiating ultraviolet rays with the wavelength not more than 220 nm from above the depletable resist layer toward a bottom of the hole under an atmosphere containing a radical source.

Moreover, the depletable resist layer may preferably have a thickness of 0.05 to 5 μm.

Moreover, the depletable resist layer may be made of a resin of the same substance as the resin constituting the insulating layer, and
the desmear treatment step may be ended with part of the depletable resist layer remaining.

Alternatively, the desmear treatment step may be ended after disappearance of the entire depletable resist layer.

A method of manufacturing a wiring board material according to the present invention is a method of manufacturing a wiring board material to be subjected to the above-described desmear treatment method.

The method includes: layering a composite insulating layer forming material, which is formed by a layered product in which the insulating layer is formed on a base layer via the depletable resist layer, on the conductive layer so that the insulating layer is in contact with the conductive layer; and then removing the base layer.

A composite insulating layer forming material according to the present invention is used in the above-described method of manufacturing a wiring board material and comprises a layered product in which the insulating layer is formed on a base layer via the depletable resist layer.

A composite insulating layer forming material according to the present invention is also used for manufacturing a wiring board material to be subjected to the above-described desmear treatment method and comprises a layered product in which the insulating layer is formed on a base layer via the depletable resist layer.

Advantageous Effects of Invention

According to the desmear treatment method of the present invention, the desmear treatment can be sufficiently performed on the interior of the hole formed in the insulating layer without requiring a complicated treatment step and the insulating layer having appropriate surface roughness can be obtained.

DESCRIPTION OF EMBODIMENTS

An embodiment of the present invention will be described below.

Figure 1:
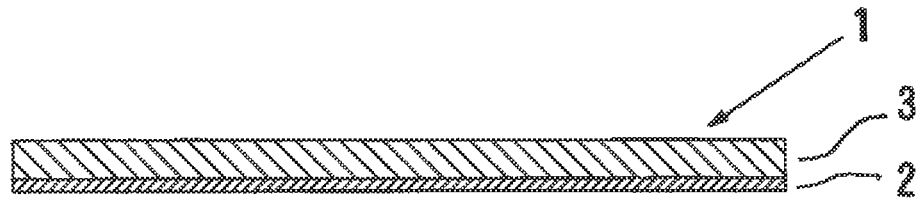
FIG. 1 is an explanatory sectional view illustrating the construction of a main part of an exemplary wiring board material to be treated by a desmear treatment method of the present invention.

FIG. 1 is an explanatory sectional view illustrating the construction of a main part of an exemplary wiring board material to be treated by a desmear treatment method of the present invention. The wiring board material 1 is formed by a layered product in which an insulating layer 3 made of a resin containing a filler is layered on a conductive layer 2 made of a metal.

As examples of the metal constituting the conductive layer 2, may be mentioned copper, nickel and gold.

Moreover, the thickness of the conductive layer 2 is 10 to 100 μm, for example.

As the resin constituting the insulating layer 3, may be used an epoxy resin, a bismaleimide-triazine resin, a polyimide resin and a polyester resin.

As examples of the filler material contained in the insulating layer 3, may be mentioned silica, alumina, mica, silicate, barium sulfate, magnesium hydroxide and titanium oxide. The average particle size of the filler is 0.1 to 3 μm, for example.

Moreover, the content of the filler in the insulating layer 3 is 20 to 60% by mass, for example.

In the desmear treatment method of the present invention, a hole forming step of forming a hole passing through the insulating layer in the above-described wiring board material 1 in the thickness direction thereof and a desmear treatment step of treating the wiring board material 1 having undergone the hole forming step with radicals are performed.

Figure 2:
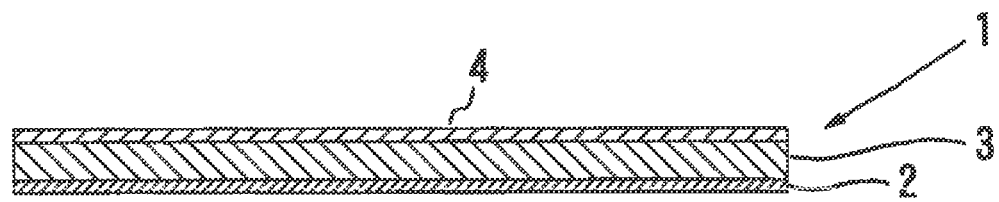
FIG. 2 is an explanatory sectional view illustrating a state in which a depletable resist layer is formed on an insulating layer in the wiring board material.

As shown in FIG. 2, it is preferable that a depletable resist layer 4 is formed on the insulating layer 3 in the wiring board material 1 to be subjected to the hole forming step. The depletable resist layer 4 is made of a resin capable of being depleted by bringing it in contact with radicals in the subsequent desmear treatment step.

As the resin constituting the depletable resist layer 4, may be used an acrylic resin, a urethane resin, an epoxy resin, a phthalic acid resin and a vinyl resin.

When the desmear treatment step to be described later is ended after the depletion of the entire depletable resist layer 4, it is preferable that a thermoplastic resin is used as the resin constituting the depletable resist layer 4. When a thermosetting resin is used, it may be difficult to remove the depletable resist layer 4 in the desmear treatment step to be described later.

Moreover, when the desmear treatment step to be described later is ended with part of the depletable resist layer 4 remaining, it is preferable that a resin of the same substance as the resin constituting the insulating layer 3 is used as the resin constituting the depletable resist layer 4.

The thickness of the depletable resist layer 4 may preferably be 0.05 to 5 μm.

If the thickness is smaller than 0.05 μm, the entire depletable resist layer 4 disappears before smear is sufficiently removed. Thus, the exposed insulating layer 3 is asked. This leads to the exposure of the filler on a surface of the insulating layer 3. Consequently, the surface of the insulating layer 3 is excessively roughened. If the thickness is greater than 5 μm, on the other hand, the thickness of the depletable resist layer 4 relative to the hole to be formed becomes large, i.e., the aspect ratio becomes large. Thus, this leads to a problem of a lowered desmear treatment speed. Specifically, if ultraviolet rays irradiated on the wiring board material 1 are parallel rays, the light quantity ratio between an opening of the hole and a bottom of the hole is 1:1. If ultraviolet rays irradiated on the wiring board material 1 are not parallel rays, however, the light quantity that can reach the bottom of the hole is reduced. Thus, the light quantity ratio between the opening of the hole and the bottom of the hole is 1:0.2, for example. Therefore, it can be understood that the thickness of the depletable resist layer 4 may be 1 to 5 times the thickness of the smear. Since the thickness of the smear is typically about 0.05 to 1 µm, the thickness of the depletable resist layer 4 may preferably be 0.05 to 5 µm. The actual thickness of the depletable resist layer 4 may be set in consideration of an amount of time needed to sufficiently remove the smear on the bottom of the hole by the desmear treatment and an asking speed of the depletable resist layer 4, for example.

The wiring board material 1 with such a depletable resist layer 4 can be manufactured as follows.

Figure 3:
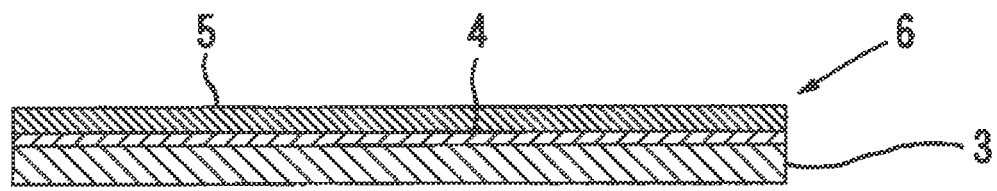
FIG. 3 is an explanatory sectional view illustrating the construction of a composite insulating layer forming material.

First, a composite insulating layer forming material 6, which is formed from a layered product in which the insulating layer 3 is formed on a base layer 5 via the depletable resist layer 4, is manufactured as shown in FIG. 3.

Figure 4:
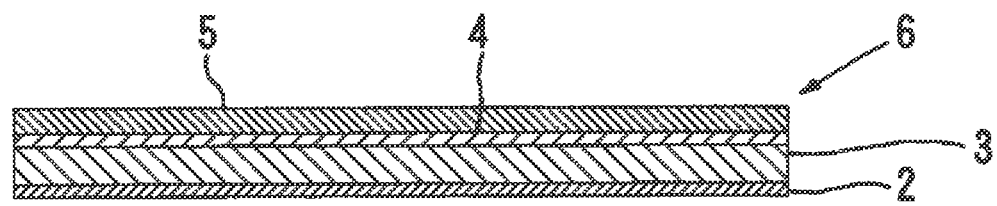
FIG. 4 is an explanatory sectional view illustrating a state in which the composite insulating layer forming material is layered on a conductive layer.

Next, the composite insulating layer forming material 6 is layered on and bonded to the conductive layer 2 formed on a surface of an insulating substrate (not shown), for example, so that the insulating layer 3 is brought into contact with the conductive layer 2 as shown in FIG. 4. After that, the base layer 5 is removed from the depletable resist layer 4. This yields the wiring board material 1 including the depletable resist layer 4.

As examples of the material constituting the base layer 5 in the above, may be mentioned a PET film, a polyethylene film, a polypropylene film and a polycarbide film. Moreover, the thickness of the base layer 5 is 10 to 200 µm, for example.

The composite insulating layer forming material 6 can be manufactured as follows, for example.

First, a coating liquid for forming the depletable resist layer, which is obtained by incorporating the resin material constituting the depletable resist layer 4 in a suitable solvent, and a coating liquid for forming the insulating layer, which is obtained by incorporating the resin material and the filler constituting the insulating layer 3 in a suitable solvent, are prepared. Next, the coating liquid for forming the depletable resist layer is applied to a surface of the base layer 5 treated with a parting agent and then dried to form the depletable resist layer 4. After that, the coating liquid for forming the insulating layer is applied to a surface of the depletable resist layer 4 and then dried to form the insulating layer 3. In this manner, the composite insulating layer forming material 6 can be manufactured.

A die coater may be used as means for applying the coating liquid for forming the depletable resist layer and the coating liquid for forming the insulating layer in the above.

A thermal compression bonding method may be used as the method for bonding the insulating layer 3 to the conductive layer 2.

Moreover, the base layer 5 is removed from the depletable resist layer 4 by peeling.

Figure 5:
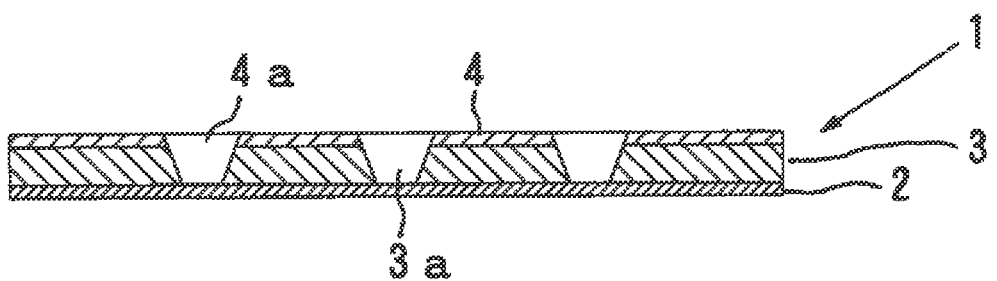
FIG. 5 is an explanatory sectional view illustrating a state in which holes are formed in the depletable resist layer and the insulating layer.

In the hole forming step, a hole 4a passing through the depletable resist layer 4 in the thickness direction thereof is formed and a hole 3a communicated with the hole 4a and passing through the insulating layer 3 in the thickness direction thereof is formed as shown in FIG. 5.

As examples of a method for forming the holes 3a and 4a in the insulating layer 3 and the depletable resist layer 4, respectively, may be mentioned a drill machining method and a laser machining method. When the holes 3a and 4a are formed by laser machining, a carbon dioxide laser device or a YAG laser device, for example, can be used.

The ratio of the sum of the thicknesses of the insulating layer 3 and the depletable resist layer 4 to the diameter of the hole 3a in the insulating layer 3 is preferably not more than 2.5, more preferably not more than 2. The ratio exceeding 2.5 leads to a problem of a lowered desmear treatment speed.

In the thus obtained wiring board material 1, smear generated in the formation of the hole 3a remains on the inner wall surface of the hole 3a in the insulating layer 3 and the bottom of the hole 3a, i.e., a portion of the conductive layer 2 exposed by the hole 3a.

In the desmear treatment step, the inner surface and bottom surface of the hole 3a formed in the insulating layer 3 are subjected to a desmear treatment by radicals. Moreover, the depletable resist layer 4 is depleted by the radicals in the desmear treatment step.

As an example of a specific treatment method in the desmear treatment step, may be mentioned a method according to which ultraviolet rays with a wavelength not more than 220 nm are irradiated from above the depletable resist layer 4 toward the bottom of the hole 3a in the insulating layer 3 under an atmosphere containing a radical source.

In such a desmear treatment step, a source for generating radicals by being irradiated with ultraviolet rays having a wavelength not more than 220 nm is used as the radical source. As specific examples of the radical source, may be mentioned a source for generating oxygen radicals such as an oxygen gas or ozone and a source for generating OH radicals such as water vapor.

Moreover, the concentration of the radical source in the atmosphere gas is appropriately selected according to the type of the radical source. When the radical source is an oxygen gas, for example, the concentration of the oxygen gas may preferably be 50 to 100%.

The ultraviolet rays to be irradiated on the wiring board material 1 should have a wavelength not more than 220 nm, preferably not more than 190 nm. If the wavelength of the ultraviolet rays exceeds 220 nm, it becomes difficult to remove the smear and the depletable resist layer 4.

As examples of a light source of ultraviolet rays with a wavelength not more than 220 nm, may be mentioned a xenon excimer lamp (peak wavelength: 172 nm), a low-pressure mercury lamp (emission line: 185 nm) and a rare-gas fluorescent lamp.

The illuminance of the ultraviolet rays irradiated on the wiring board material 1 is 10 to 1,000 mW/cm$^2$, for example. Moreover, an amount of time for irradiating the wiring board material 1 with ultraviolet rays is 1 to 180 minutes, for example, although it is appropriately set in consideration of the illuminance of the ultraviolet rays, the state of remaining smear, and the like.

Figure 6:
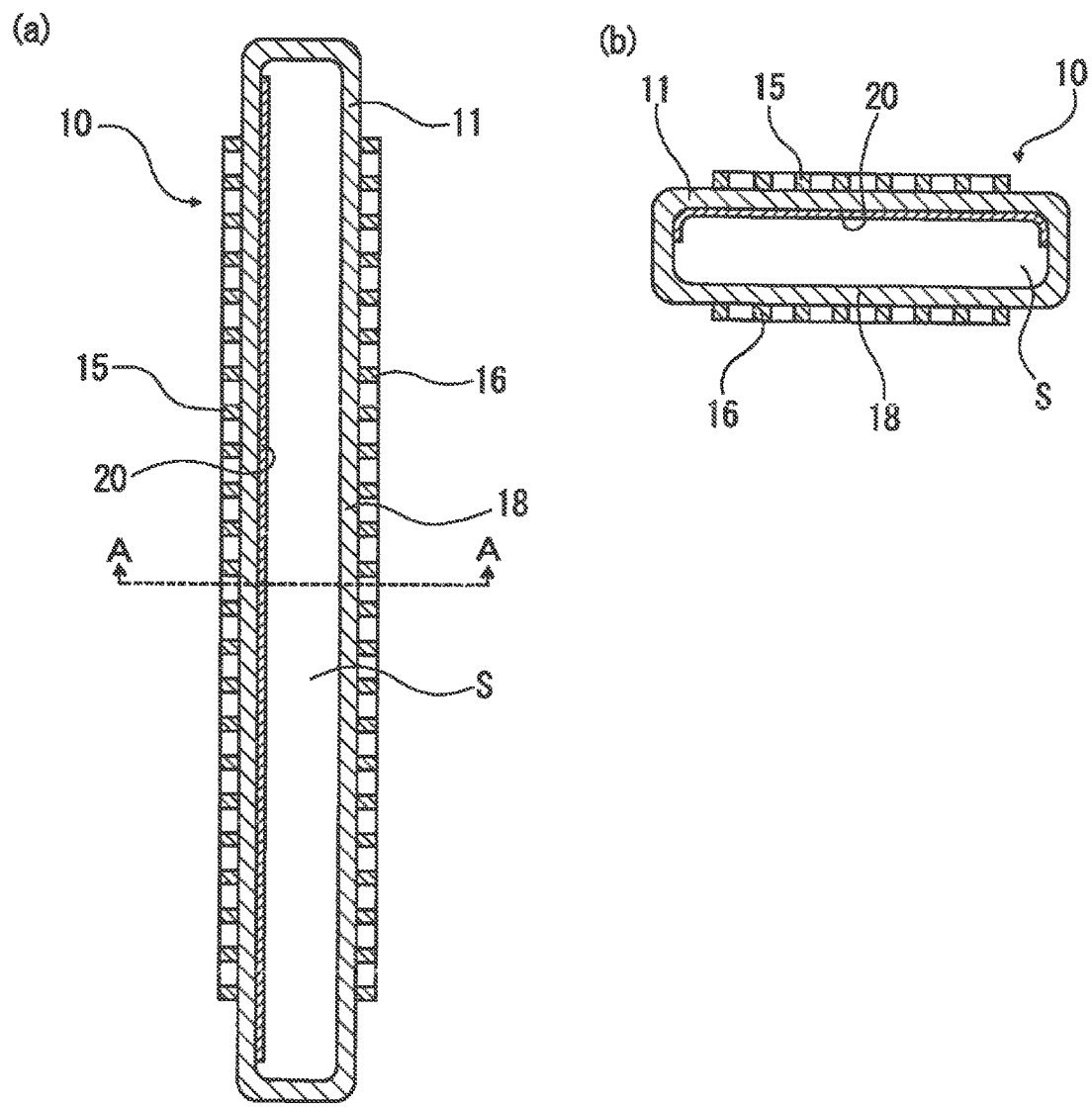
FIG. 6 is an explanatory sectional view illustrating the general construction of an exemplary excimer lamp used as a light source of ultraviolet rays with a wavelength of 220 nm, wherein (a) is a transverse sectional view illustrating a cross section along the longitudinal direction of a discharge container, and (b) is a sectional view taken along line A-A in (a).

FIG. 6 is an explanatory sectional view illustrating the general construction of an exemplary excimer lamp used as a light source of ultraviolet rays with a wavelength not more than 220 nm, wherein (a) is a transverse sectional view illustrating a cross section along the longitudinal direction of a discharge container, and (b) is a sectional view taken along line A-A in (a).

The excimer lamp 10 includes a hollow, elongated discharge container 11 having a rectangular cross section in which both ends thereof are hermetically sealed to form a discharge space S therein. A xenon gas or a gas mixture of argon and chlorine, for example, is sealed in the discharge container 11 as a discharge gas.

The discharge container 11 is made of silica glass that allows vacuum ultraviolet rays to transmit therethrough excellently, e.g., synthetic quartz glass, and has a function as a dielectric material.

A pair of lattice-shaped electrodes, i.e., one electrode 15 that functions as a high-voltage supply electrode and the other electrode 16 that functions as a ground electrode are disposed so as to extend in the longitudinal direction and be opposed to each other on the outer surfaces of longer-side faces in the discharge container 11. Thus, the discharge container 11, which functions as a dielectric material, lies between the pair of electrodes 15 and 16.

Such electrodes can be formed by paste-coating the discharge container 11 with an electrode material made of a metal or by printing or vapor deposition, for example.

In the excimer lamp 10, the supply of a lighting power to the one electrode 15 causes the generation of discharge between the electrodes 15 and 16 via the wall of the discharge container 11, which functions as a dielectric material. Consequently, excimer molecules are formed and excimer discharge, which emits vacuum ultraviolet rays from the excimer molecules, is generated. In order to efficiently utilize the vacuum ultraviolet rays generated by this excimer discharge, an ultraviolet reflection film 20 made of silica particles and alumina particles is provided on an inner surface of the discharge container 11. Here, if a xenon gas is used as the discharge gas, vacuum ultraviolet rays having a peak wavelength of 172 nm are emitted. If a gas mixture of argon and chlorine is used as the discharge gas, vacuum ultraviolet rays having a peak wavelength of 175 nm are emitted.

The ultraviolet reflection film 20 is formed, for example, over an inner surface region of the longer-side face of the discharge container 11 corresponding to the one electrode 15, which functions as a high-voltage supply electrode, and part of inner surface regions of the shorter-side faces continuous with the inner surface region of the longer-side face. A light-outputting part (aperture part) 18 is formed due to no ultraviolet reflection film 20 provided in an inner surface region of the longer-side face of the discharge container 11 corresponding to the other electrode 16, which functions as a ground electrode.

The thickness of the ultraviolet reflection film 20 may preferably be 10 to 100 μm, for example.

In the ultraviolet reflection film 20, the silica particles and the alumina particles themselves have high refractive indexes and a vacuum ultraviolet transmitting property. Thus, part of vacuum ultraviolet rays having reached the silica particles or the alumina particles is reflected at the surfaces of such particles, and the other part thereof is refracted and enters the particles. Furthermore, much of the light entering the particle is transmitted (partially absorbed) and again refracted when outputted. The ultraviolet reflection film 20 has a "diffuse reflection" function of repeatedly causing such reflections and refractions.

Since the ultraviolet reflection film 20 is formed by silica particles and alumina particles, i.e., ceramic, no impurity gas is generated and the ultraviolet reflection film 20 has a discharge-proof property.

As an example of the silica particles constituting the ultraviolet reflection film 20, may be mentioned fine particles obtained by processing silica glass into powders.

The silica particles preferably have particle sizes, defined as follows, falling within a range of 0.01 to 20 μm, for example. Additionally, their median particle size (the peak value of the number average particle size) is preferably 0.1 to 10 μm, for example, more preferably 0.3 to 3 μm.

Moreover, the percentage of silica particles having such a median particle size may preferably be not lower than 50%.

The alumina particles constituting the ultraviolet reflection film 20 preferably have particle sizes falling within a range of 0.1 to 10 μm, for example. Additionally, their median particle size (the peak value of the number average particle size) is preferably 0.1 to 3 μm, for example, more preferably 0.3 to 1 μm.

Moreover, the percentage of alumina particles having such a median particle size may preferably be not lower than 50%.

According to the desmear treatment method of the present invention, the desmear treatment step may be ended with part of the depletable resist layer 4 remaining or may be ended after the disappearance of the entire depletable resist layer 4.

If the desmear treatment step is ended with part of the depletable resist layer 4 remaining, the surface of the wiring board material 1 includes a surface layer portion in which part of the remaining depletable resist layer 4 forms the surface of the insulating layer 3. Since the depletable resist layer 4 contains no filler, the insulating layer 3 having appropriate surface roughness can be obtained due to asking by the desmear treatment.

Alternatively, if the desmear treatment step is ended immediately after the disappearance of the entire depletable resist layer 4, the insulating layer 3 is prevented from being ashed by the desmear treatment. In other words, the surface roughness of the insulating layer 3 before the desmear treatment can be maintained, thus yielding the insulating layer 3 having appropriate surface roughness.

Alternatively, if the desmear treatment step is continued after the disappearance of the entire depletable resist layer 4, the exposed insulating layer 3 is ashed. This allows for the adjustment of the surface roughness of the insulating layer 3, thus yielding the insulating layer 3 having appropriate surface roughness.

Moreover, according to the desmear treatment method of the present invention, the whole or a large portion of the depletable resist layer 4 is removed by the desmear treatment step. This eliminates the need to perform a process of removing the depletable resist layer 4 and the need to perform a process of roughening the insulating layer 3 after the desmear treatment.

Therefore, according to the desmear treatment method of the present invention, the desmear treatment can be sufficiently performed on the interior of the hole 3a formed in the insulating layer 3 without requiring a complicated treatment step and the insulating layer 3 having appropriate surface roughness can be obtained.

The present invention is not limited to the above-described embodiment, and modifications as follows can be made thereto. For example, the depletable resist layer 4 may be formed on the surface of the insulating layer 3 after the hole forming step is performed. Moreover, the use of the composite insulating layer forming material 6 is not essential in the manufacture of the wiring board material 1 in which the depletable resist layer 4 is formed. For example, the wiring board material 1 in which the insulating layer 3 is layered on the conductive layer 2 may be manufactured by an appropriate method. After that, the coating liquid for forming the depletable resist layer may be applied to the surface of the insulating layer 3 in this wiring board material 1 and then dried to form the depletable resist layer 4.

In the desmear treatment step, the desmear treatment may alternatively be performed with radicals due to plasma discharge.

Alternatively, in order to remove the smear, caused by the filler, from the wiring board material 1, the wiring board material 1 may be subjected to a physical vibration treatment such as ultrasonication, for example, after the completion of the desmear treatment step.

EXAMPLES

While specific examples of the present invention will be described below, the present invention is not limited to these examples.

Moreover, in the following examples, surface roughness Ra was measured with "Nanoscale Hybrid Microscope VN-8010" manufactured by KEYENCE CORPORATION under conditions of an observation area of 50 μm×38 μm.

Example 1

(1) Manufacture of Wiring Board Material

A copper-clad laminate in which copper foil was layered on a surface of an insulating substrate to have a thickness of 0.4 mm was prepared. The copper foil in the copper-clad laminate was subjected to photolithography and etching to form a conductive layer having a required pattern on the surface of the insulating substrate.

An insulating film ("ABF-GX92" manufactured by Ajinomoto Fine-Techno Co., Inc.) in which an insulating layer containing a filler was layered on a PET film, which was a carrier layer, was laminated on the surface of the insulating substrate including the conductive layer. After that, the PET film was peeled off. The thickness of the insulating layer in this insulating film was 20 μm. Such lamination was performed with a batch-type vacuum pressure laminator at an atmospheric pressure not more than 10,000 hPa under conditions of a temperature of 110° C. and a pressure of 500 kN/m$^2$. After that, the insulating layer was subjected to a thermal curing treatment at 170° C. for 30 minutes.

In this manner, a wiring board material including the conductive layer and the insulating layer made of an epoxy resin containing the filler was manufactured. The surface roughness Ra of the insulating layer in this wiring board material was 52 nm.

(2) Formation of Depletable Resist Layer

A coating acrylic lacquer ("Mr. COLOR 46 (clear)" manufactured by GIS Creos corporation) was applied to the surface of the insulating layer in the wiring board material with a spin coater under conditions of a number of revolution of 5,000 rpm and a rotation time of two minutes. The applied film was dried at a room temperature for 10 minutes to form a depletable resist layer having a thickness of 2 μm and made of an acrylic resin on the surface of the insulating layer.

(3) Hole Forming Step

The wiring board material including the depletable resist layer formed therein was subjected to laser machining with a carbon dioxide laser device to form a hole passing through the depletable resist layer and the insulating layer and having a diameter of 50 μm.

(4) Desmear Treatment Step

The wiring board material having undergone the above-described hole forming step (3) was placed on a stage provided with heating means. After that, the wiring board material was subjected to a desmear treatment by being irradiated with ultraviolet rays through an ultraviolet transmissive window while being supplied with an oxygen gas. Specific conditions of the desmear treatment were as follows.

Light source of ultraviolet rays: xenon-excimer lamp, effective emission length–300 mm, the number of the light sources=1
Ultraviolet illuminance at the outer surface of the ultraviolet transmissive window=100 W/cm$^2$
Clearance between the ultraviolet transmissive window and the depletable resist layer=0.5 mm
Ultraviolet irradiation time=5 minutes
Flow rate of oxygen gas=1 L/min
Temperature of the stage: 120° C.

As a result of the observation of the wiring board material after the completion of the desmear treatment step, it was confirmed that the entire depletable resist layer disappeared.

(5) Physical Vibration Treatment

The wiring board material having undergone the above-described desmear treatment step (4) was subjected to a physical vibration treatment in water under the following conditions.

Vibration plate: size=400 mm×320 mm
Distance between the front surface of the vibration plate and the water surface: 130 mm
Distance between the front surface of the wiring board material and the water surface: 20 mm
Power density: 48 W/L (100%)
Frequency: 25 kHz
Treatment time: 30 seconds Example 2

(1) Manufacture of Composite Insulating Layer Forming Material

Twenty parts by mass of a liquid bisphenol A epoxy resin ("jER@ 828EL" manufactured by Mitsubishi Chemical Corporation), 12 parts by mass of an epoxy resin curing agent ("jER@ cure ST12" manufactured by Mitsubishi Chemical Corporation) and a diluent ("reactive diluent YDE" manufactured by Mitsubishi Chemical Corporation) were mixed together to prepare a coating liquid for forming a depletable resist layer.

The coating liquid for forming a depletable resist layer was applied, with a die coater, to a base layer made of a PET film (manufactured by Lintec Corporation, a thickness of 38 μm) with an alkyd-type parting agent (AL-5). The coated liquid was subjected to a drying treatment at 100° C. for 5 minutes to form a depletable resist layer made of the epoxy resin and having a thickness of 1.5 μm on the base layer.

Next, 28 parts by mass of a liquid bisphenol A epoxy resin ("jER@ 828EL" manufactured by Mitsubishi Chemical Corporation), 28 parts by mass of a naphthalene tetrafunctional epoxy resin ("HP4700" manufactured by Dainippon Ink and Chemicals, Inc.) and 20 parts by mass of a phenoxy resin ("YX6954BH30" manufactured by Mitsubishi Chemical Corporation) were added to a mixed solvent, including 15 parts by mass of methyl ethyl ketone and 15 parts by mass of cyclohexanone, and dissolved by heating while being stirred. To the thus obtained solution, 27 parts by mass of a methyl ethyl ketone solution with a solid content of 60% by weight of a triazine-containing phenol novolac resin ("LA7054" manufactured by DIC Corporation, nitrogen content: about 12% by weight), 27 parts by mass of a methyl ethyl ketone solution with a solid content of 50% by mass of a naphthol-based curing agent ("SN-485" manufactured by Tohto Kasei Co., Ltd.), 0.1 parts by mass of a curing catalyst ("2E4MZ" manufactured by SHIKOKU CHEMICALS CORPORATION), 70 parts by mass of spherical silica (average particle size: 0.5 μm, "SOC2" manufactured by Admatechs) and a 1:1 solution of ethanol and toluene with a solid content of 15% by weight of a polyvinyl butyral resin ("KS-1" manufactured by SEKISUI CHEMICAL CO., LTD.) were added and mixed together to prepare a coating liquid for forming an insulating layer.

This coating liquid for forming an insulating layer was applied to a surface of the depletable resist layer with a die coater. The coated liquid was subjected to a drying treatment at 100° C. for 5 minutes to form an insulating layer with a thickness of 20 μm on the depletable resist layer.

In this manner, the composite insulating layer forming material in which the depletable resist layer and the insulating layer were layered on the base layer was manufactured.

(2) Manufacture of Wiring Board Material

A copper-clad laminate in which copper foil having a thickness of 4 mm was layered on a surface of an insulating substrate was prepared. The copper foil in this copper-clad laminate was subjected to photolithography and etching to form a conductive layer having a required pattern on the surface of the insulating substrate.

The composite insulating layer forming material was disposed on the surface of the insulating substrate including the conductive layer so that the insulating layer thereof was in contact with the surface of the insulating substrate. After that, the insulating substrate and the composite insulating layer forming material were laminated together with a batch-type vacuum pressure laminator at an atmospheric pressure not more than 10,000 hPa under conditions of a temperature of 110° C. and a pressure of 500 kN/m$^2$. After that, the base layer was peeled off. After that, the depletable resist layer and the insulating layer were subjected to a thermal curing treatment at 170° C. for 30 minutes.

In this manner, a wiring board material in which the conductive layer and the insulating layer made of an epoxy resin containing a filler were included and the depletable resist layer was formed on the insulating layer was manufactured.

(3) Hole Forming Step

The wiring board material including the depletable resist layer formed therein was subjected to laser machining with a carbon dioxide laser device to form a hole passing through the depletable resist layer and the insulating layer and having a diameter of 50 μm.

(4) Desmear Treatment Step

The wiring board material having undergone the above-described hole forming step (3) was placed on a stage provided with heating means. After that, the wiring board material was subjected to a desmear treatment by being irradiated with ultraviolet rays through an ultraviolet transmissive window while being supplied with an oxygen gas (concentration: 100%). Specific conditions of the desmear treatment were as follows.

Light source of ultraviolet rays: xenon-excimer lamp, effective emission length=300 mm, the number of the light sources=1
Ultraviolet illuminance at the outer surface of the ultraviolet transmissive window=100 W/cm$^2$
Clearance between the ultraviolet transmissive window and the depletable resist layer=0.5 mm
Ultraviolet irradiation time=5 minutes
Flow rate of oxygen gas=1 L/min
Temperature of the stage: 120° C.

As a result of the observation of the wiring board material after the completion of the desmear treatment step, it was confirmed that part of the depletable resist layer remained.

(5) Physical Vibration Treatment

The wiring board material having undergone the above-described desmear treatment step (4) was subjected to ultrasonication (physical vibration treatment) in water under the following conditions.

Vibration plate: size=400 mm×320 mm
Distance between the front surface of the vibration plate and the water surface: 130 mm
Distance between the front surface of the wiring board material and the water surface: 20 mm
Power density: 48 W/L (100%)
Frequency: 25 kHz
Treatment time: 30 seconds Comparative Example 1

A wiring board material was manufactured in the same manner as that in Example 1 except that no depletable resist layer was formed. The resulting wiring board material was subjected to the hole forming step, the desmear treatment step and the physical vibration treatment.

Evaluation:

The surface roughness Ra of the insulating layer was measured in each of the wiring board materials having undergone the desmear treatment and the physical vibration treatment in Examples 1 and 2 and Comparative example 1. Also, the bottom of the hole of the insulating layer in each of these wiring board materials was observed to determine the presence or absence of smear. The results are shown in Table 1.

TABLE 1

|  | SURFACE ROUGHNESS Ra (nm) | PRESENCE OR ABSENCE OF SMEAR |
|---|---|---|
| EXAMPLE 1 | 56 | NONE |
| EXAMPLE 2 | 65 | NONE |
| COMPARATIVE EXAMPLE 1 | 135 | NONE |

As is apparent from the results in Table 1, it was confirmed that the desmear treatment can be sufficiently performed on the interior of the hole formed in the insulating layer and the surface of the insulating layer can have appropriate roughness.

REFERENCE SIGNS LIST 1 wiring board material
2 conductive layer
3 insulating layer
3a hole
4 depletable resist layer
4a hole
5 base layer
6 composite insulating layer forming material
10 excimer lamp
11 discharge container
15 one electrode (high-voltage supply electrode)
16 the other electrode (ground electrode)
18 light-outputting part (aperture part)
20 ultraviolet reflection film

The invention claimed is:

1. A desmear treatment method for a wiring board material comprising steps of:
providing the wiring board material, including an insulating layer made of a resin containing a filler, directly on a conductive layer;
forming a hole passing through the insulating layer in a thickness direction of the insulating layer; and
desmear treating, with radicals generated by irradiating a radical source with ultraviolet rays, the wiring board material having the hole passing through the insulating layer, wherein
the providing of the wiring board material further comprising:

forming a depletable resist layer made of a resin on the insulating layer prior to the desmear treating, and depleting the depletable resist layer in a way such that a whole or a large portion of the depletable resist layer is removed by the desmear treating.

2. The desmear treatment method according to claim 1, further comprising:

prior to the forming a hole passing to the insulating layer, providing the wiring board material with the depletable resist layer formed on the insulating layer.

3. The desmear treatment method according to claim 1, further comprising:

performing the desmear treating by radiating ultraviolet rays with a wavelength of not more than 220 nanometers (nm) from above the depletable resist layer toward a bottom of the hole under an atmosphere containing the radical source.

4. The desmear treatment method according to claim 1, wherein the depletable resist layer has a thickness of 0.05 to 5 μm.

5. The desmear treatment method according to claim 1, wherein the depletable resist layer is made of the resin of the insulating layer, and the desmear treating ends with only partial removal of the depletable resist layer.

6. The desmear treatment method according to claim 1, wherein the desmear treating ends after disappearance of an entirety of the depletable resist layer.

7. The desmear treatment method according to claim 1, wherein the radical source is at least one of oxygen gas, ozone, and water vapor.

* * * * *